US007845073B2

(12) United States Patent
Lee et al.

(10) Patent No.: US 7,845,073 B2
(45) Date of Patent: Dec. 7, 2010

(54) METHOD OF MANUFACTURING CIRCUIT BOARD EMBEDDING THIN FILM CAPACITOR

(75) Inventors: In Hyung Lee, Seoul (KR); Yul Kyo Chung, Gyunggi-do (KR); Bae Kyun Kim, Gyunggi-do (KR); Seung Eun Lee, Gyunggi-do (KR); Jung Won Lee, Seoul (KR)

(73) Assignee: Samsung Electro-Mechanics Co., Ltd., Gyunggi-do (KR)

( * ) Notice: Subject to any disclaimer, the term of this patent is extended or adjusted under 35 U.S.C. 154(b) by 0 days.

(21) Appl. No.: 12/000,125

(22) Filed: Dec. 10, 2007

(65) Prior Publication Data

US 2008/0158770 A1 Jul. 3, 2008

(30) Foreign Application Priority Data

Dec. 29, 2006 (KR) ..................... 10-2006-0137585

(51) Int. Cl.
*H05K 3/02* (2006.01)
*H05K 3/10* (2006.01)

(52) U.S. Cl. ............................ 29/846; 29/830; 29/831; 29/832; 438/46; 438/93; 438/455

(58) Field of Classification Search .................. 29/846, 29/830–832, 842, 847; 257/E21.567, E27.006; 361/301.1, 761; 438/46, 47, 93, 455, 795
See application file for complete search history.

(56) References Cited

U.S. PATENT DOCUMENTS 5,261,153 A 11/1993 Lucas
6,071,795 A 6/2000 Cheung et al.
6,541,137 B1 4/2003 Kingon et al.
6,887,770 B2 * 5/2005 Ueda et al. .................. 438/455
6,964,201 B2 * 11/2005 Xu et al. ....................... 73/794
2006/0076584 A1 4/2006 Kim et al.

FOREIGN PATENT DOCUMENTS

JP 2004-260176 9/2004
JP 2005-039234 2/2005
JP 2005-252308 9/2005
KR 10-2006-0067188 6/2006

OTHER PUBLICATIONS

Japanese Office Action, w/ English translation thereof, issued in Japanese Patent Application No. JP 2007-321378 dated Mar. 9, 2010.

* cited by examiner

*Primary Examiner*—Thiem Phan
(74) *Attorney, Agent, or Firm*—McDermott Will & Emery LLP

(57) ABSTRACT

A method of manufacturing a circuit board embedding a thin film capacitor, the method including: forming a sacrificial layer on a first substrate; forming a dielectric layer on the sacrificial layer; forming a first electrode layer on the dielectric layer; disposing the first substrate on the second substrate in such a way that the first electrode layer is bonded to a top of a second substrate; decomposing the sacrificial layer by irradiating a laser beam onto the sacrificial layer through the first substrate; separating the first substrate from the second substrate; and forming a second electrode layer on the dielectric layer.

15 Claims, 4 Drawing Sheets

26
14
16
23
21

FIG. 1A
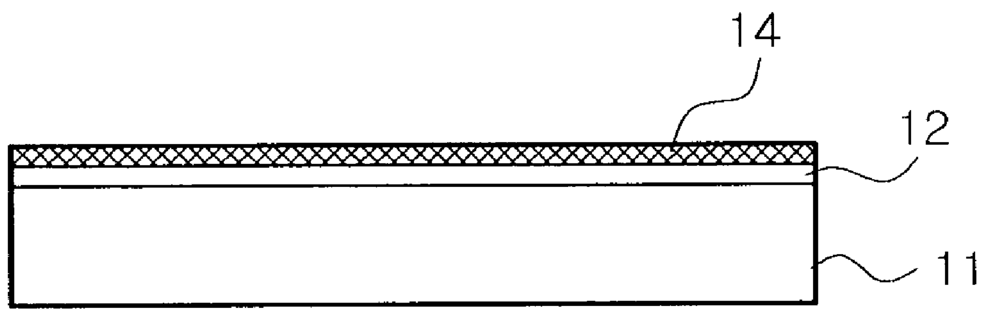
FIG. 1B
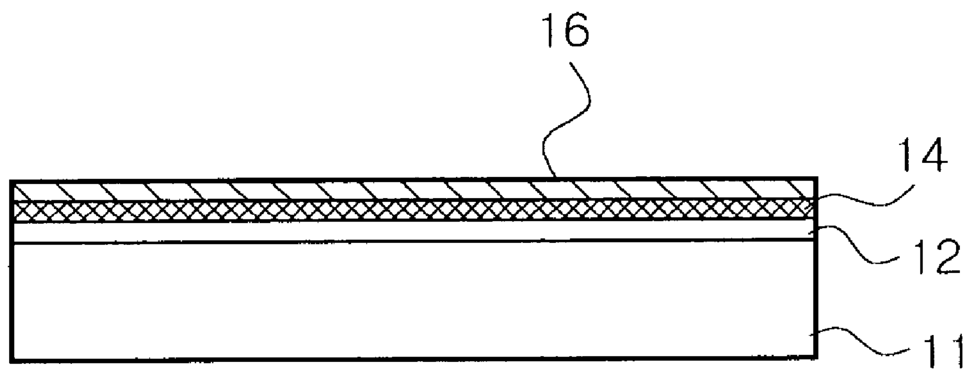
FIG. 1C

METHOD OF MANUFACTURING CIRCUIT BOARD EMBEDDING THIN FILM CAPACITOR

CROSS-REFERENCE TO RELATED APPLICATIONS

This application claims the priority of Korean Patent Application No. 2006-137585 filed on Dec. 29, 2006, in the Korean Intellectual Property Office, the disclosure of which is incorporated herein by reference.

BACKGROUND OF THE INVENTION

1. Field of the Invention

The present invention relates to a method of manufacturing a circuit board such as a printed circuit board, and more particularly, to a circuit board embedding a thin film capacitor in which the thin film capacitor is fabricated using a laser lift-off process.

2. Description of the Related Art

With a trend of smaller size, lighter weight, higher speed and higher frequency in electronic devices, the electronic devices are increasingly required to be highly integrated. To this end, vigorous studies have been conducted on technologies for integrating passive and active devices into a board to enhance efficiency.

In related efforts to achieve smaller electronic devices, studies have been under way to embed many passive devices such as a resistor, a capacitor and an inductor in the PCB in place of mounting them thereon. A capacitor accounts for about 60% of the passive devices, which is a considerable proportion, thus heightening interests in an embedded capacitor. As described above, the capacitor, when embedded in the PCB in place of being mounted thereon, allows the electronic devices to be reduced in size by about 40% and enhances electrical characteristics at a high frequency due to low impedance (<10 pH) at the high frequency.

Such an embedded capacitor generally includes two copper foils (conductive layers) and a prepreg insulating layer therebetween. As an example, U.S. Pat. No. 5,261,153 discloses a technology of manufacturing a capacitor-embedded printed circuit board by depositing uncured dielectric sheets between conductive foils. Also, U.S. Pat. No. 6,541,137 discloses a capacitor embedding a high temperature thin film using a dielectric material, in which a barrier layer is formed to prevent a conductive layer from oxidizing due to heat treatment at a high temperature of 400 to 800° C.

As described above, a dielectric film of the thin film capacitor needs to be heat treated at a high temperature to be crystallized to have a high permittivity.

However, in the conventional capacitor embedded in the PCB, the insulating layer is formed of polymer and thus not capable of undergoing high temperature heat treatment which causes the board to be deformed.

Moreover, when the dielectric layer is deposited on the copper foil and heat treated, the copper foil may be easily oxidized. Here, the capacitor may be significantly degraded in desired characteristics due to effects of an oxidized interface.

These problems have led to an intense demand for developing a process in which an embedded capacitor with a dielectric film requiring high temperature heat treatment is beneficially applied to a multilayer circuit board such as the PCB.

SUMMARY OF THE INVENTION

An aspect of the present invention provides a multilayer circuit board embedding a thin film capacitor in which a transfer process is improved using a laser lift-off process to minimize damage to a dielectric layer for the thin film capacitor.

According to an aspect of the present invention, there is provided a method of manufacturing a circuit board embedding a thin film capacitor, the method including: forming a sacrificial layer on a first substrate; forming a dielectric layer on the sacrificial layer; forming a first electrode layer on the dielectric layer; disposing the first substrate on the second substrate in such a way that the first electrode layer is bonded to a top of a second substrate; decomposing the sacrificial layer by irradiating a laser beam onto the sacrificial layer through the first substrate; separating the first substrate from the second substrate; and forming a second electrode layer on the dielectric layer.

The sacrificial layer may be formed of a material having an energy band gap lower than an energy band gap of a material for the first substrate material.

The sacrificial layer may be formed of at least one of indium tin oxide (ITO), $La_xSr_{1-x}CoO_3$ (LSCO), $La_xPb_{1-x}CoO_3$ (LPCO), PbO and GaN.

The first substrate may be formed of a material having a band gap energy greater than an energy corresponding to a wavelength of the laser beam.

The first substrate may be formed of at least one of sapphire, quartz, glass, magnesium oxide (Mgo), lanthanum aluminate ($LaAlO_3$), fused silica, and zirconia.

The dielectric layer may be formed of at least one of plumbum zirconium titanate (PZT), plumbum lanthanium zirconium titanate (PLZT), barium titanate (BT), strontium bismuth tantalite (SBT), bismuth lanthanium titanate (BLT), plumbum magnesium-plumbum titanate (PMN-PT), and plumbum zinc niobate-plumbum titanate (PZN-PT).

At least one of the first and second electrode layers may be formed of at least one of Au, Ag, Ni, Cu, Al, Pt, Ti, Ir, $IrO_2$, Ru, and $RuO_2$. At least one of the first and second electrode layers may be formed by one of physical vapor deposition, chemical vapor deposition, atomic layer deposition, screen printing, plating and ink jet printing.

The method may further include cleaning a surface of the dielectric layer to remove a remaining material of the sacrificial layer from the dielectric layer, after the separating the first substrate from the second substrate.

The disposing the first substrate on the second substrate may include: applying a bonding material on at least one of the first electrode layer of the first substrate and the top of the second substrate; and bonding the first electrode layer of the first substrate onto the second substrate using the bonding material.

The first and second electrode layers may have a predetermined pattern, respectively.

The method may further include forming a barrier layer, between the forming a dielectric layer on the sacrificial layer and the forming a first electrode layer on the dielectric layer. The barrier layer may be formed of at least one of Ti, Cr, Al, Ta and alloys thereof.

To realize a multilayer circuit board, the method may further include forming at least one insulating layer on the second electrode layer to have at least one of a conductive line and a conductive via hole therein.

BRIEF DESCRIPTION OF THE DRAWINGS

The above and other aspects, features and other advantages of the present invention will be more clearly understood from the following detailed description taken in conjunction with the accompanying drawings, in which:

FIGS. 1A to 1C are procedural cross-sectional views for explaining a process of forming a transfer structure for a thin film capacitor employed in a method of manufacturing a circuit board embedding a thin film capacitor according to an exemplary embodiment of the invention;

DETAILED DESCRIPTION OF THE PREFERRED EMBODIMENT

Figure 2A:
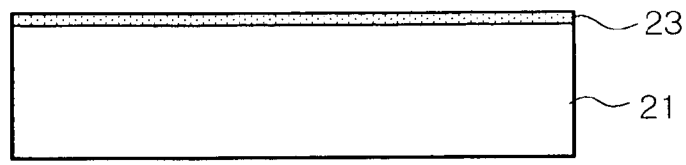
FIGS. 2A to 2D are procedural cross-sectional views for explaining a transfer process and a process of forming a thin film capacitor in a method of manufacturing a circuit board embedding a thin film capacitor according to an exemplary embodiment of the invention.

Exemplary embodiments of the present invention will now be described in detail with reference to the accompanying drawings.

FIGS. 1A to 1C are procedural views for explaining a process for forming a transfer structure for a thin film capacitor employed in a method of manufacturing a circuit board embedding a thin film capacitor according to an exemplary embodiment of the invention.

As shown in FIG. 1A, the method of the present invention starts with forming a sacrificial layer 12 on a first substrate 11.

The "sacrificial layer 12" is a layer formed of a material decomposable by energy of a laser beam used. In a later process, the laser beam will penetrate the first substrate 11 to decompose the sacrificial layer.

To selectively remove the sacrificial layer 12, the laser beam may have a focal point thereof adjusted in such a way that energy of the laser beam is focused on the sacrificial layer 12. Particularly, materials for the first substrate 11 and the sacrificial layer 12 may be appropriately selected according to a wavelength of the laser beam used.

That is, the first substrate 11 may be made of a material having a band gap energy greater than an energy corresponding to the wavelength of the laser beam to enable the laser beam to transmit therethrough. The first substrate 11 may adopt a transparent substrate. The transparent substrate may be formed of at least one of sapphire, quartz, glass, magnesium oxide (MgO), lanthanum aluminate ($LaAlO_3$), fused silica, and zirconia.

Also, the sacrificial layer 12 may be formed of a material having an energy band gap lower than an energy band gap of a material for the first substrate 11. The sacrificial layer 12 may be formed of at least one of indium tin oxide (ITO), $La_xSr_{1-x}CoO_3$ (LSCO), $La_xPb_{1-x}CoO_3$ (LPCO), PbO and GaN.

Thereafter, as shown in FIG. 1B, a desired dielectric layer 14 is formed on the sacrificial layer 12.

The first substrate employed in this process may be formed of a material with stronger thermal durability than a material for a substrate, e.g., printed circuit board (PCB) to which the first substrate is to be transferred. This accordingly may allow a high temperature thermal treatment process for improving dielectric properties or a high temperature film growth process. For example, the dielectric layer 14 may be formed by a general sol-gel method using a metal organic precursor and then heat-treated at a high temperature. Also, the dielectric layer 14 may be formed beneficially by high-temperature physical vapor deposition and chemical vapor deposition.

The dielectric layer 14 may be formed of at least one of plumbum zirconium titanate (PZT), plumbum lanthanium zirconium titanate (PLZT), barium titanate (BT), strontium bismuth tantalite (SBT), bismuth lanthanium titanate (BLT), plumbum magnesium-plumbum titanate (PMN-PT), and plumbum zinc niobate-plumbum titanate (PZN-PT).

Then as shown in FIG. 1C, a first electrode layer 16 constituting an electrode of the thin film capacitor is formed on the dielectric layer 14. The first electrode layer 16 may be formed of a metal or oxide having electrical conductivity. For example, the first electrode layer 16 may be formed of at least one of Au, Ag, Ni, Cu, Al, Pt, Ti, Ir, $IrO_2$, Ru and $RuO_2$. The first electrode layer 16 may be formed by a known process such as physical vapor deposition (PVD), chemical vapor deposition (CVD), atomic layer deposition (ALD), screen printing, plating and ink jet printing. Particularly, the first electrode layer 16 may be formed by the PVD method such as sputtering and electron beam evaporation. Optionally, the first electrode layer 16 may have a desired pattern. This patterning defines a necessary capacitor region.

Moreover, a barrier layer (not shown) may be additionally formed between the dielectric layer 14 and the first electrode layer 16 to enhance bonding strength therebetween and prevent the electrode layer from diffusing and oxidizing. The barrier layer may be formed of at least one of Ti, Cr, Al, Ta and alloys thereof, or a material such as TaN, and TiN.

The transfer structure for the thin film capacitor obtained by this process can be transferred to a desired area by a thin film capacitor process using laser lift-off.

FIGS. 2A to 2D are procedural cross-sectional views for explaining a transfer process and a process of forming a thin film capacitor in a method of manufacturing a circuit board embedding a thin film capacitor according to an exemplary embodiment of the invention.

First, as shown in FIG. 2A, a second substrate 21 having an area to which the first substrate is to be transferred, i.e., where a capacitor is formed, is provided. The second substrate 21 is formed of a polymer resin, notably a core such as a copper clad layer (CCL) used in the PCB manufacturing process or an additional insulating layer. A bonding layer 23 may be formed on the area of the second substrate 21 to which the transfer structure of FIG. 1C is to be transferred. Of course, alternatively, the bonding layer may be formed on a surface of the first electrode layer 16 which provides a bonding surface with the transfer structure. Also, the bonding layer 23 may be formed on both the second substrate 21 and the first electrode layer 16. The bonding layer 23 may be formed of a general curing material made of a polymer resin.

Figure 2B:
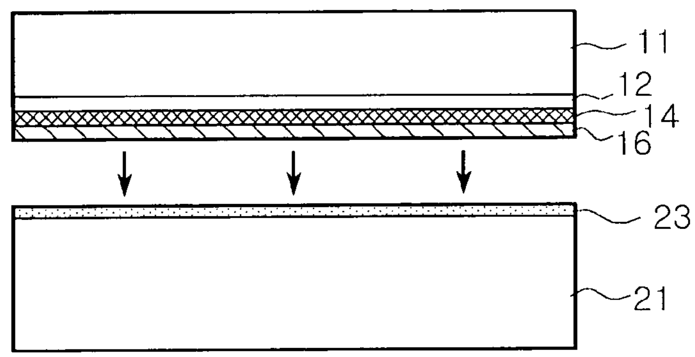

Then, as shown in FIG. 2B, the first substrate 11 is disposed on the second substrate 21 so that the first electrode layer 16 is bonded onto the second substrate 21.

Here, the transfer structure shown in FIG. 2B is understood to be manufactured by processes of FIGS. 1A to 1C. That is, the transfer structure includes the sacrificial layer 12 formed on the first substrate 11 such as a transparent substrate, the dielectric layer 14 formed on the sacrificial layer 12 and the first electrode layer 16 formed on the dielectric layer 14. In the present embodiment, the first electrode layer 16 is bonded to the second substrate 21 via the bonding layer 23. However, the first electrode layer 16 and the second substrate 21 may be bonded together by other known bonding technology such as thermocompression.

Figure 2C:
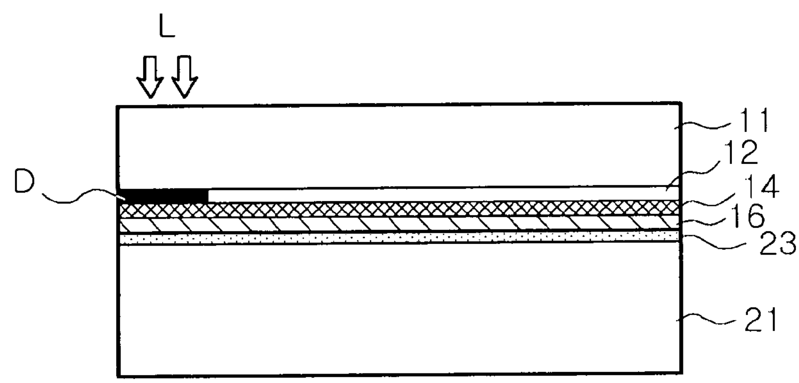

Next, as shown in FIG. 2C, a laser beam L is irradiated through the first substrate 11 to decompose the sacrificial layer 12.

The laser beam L irradiated is absorbed in the sacrificial layer 12 between the first substrate 11 and the dielectric layer 14 to locally increase temperature of the sacrificial layer 12, thereby decomposing a material for the sacrificial layer 12, as indicated with D. This process employs the sacrificial layer 12 which is to be decomposed by concentrated energy of the laser beam L to minimize damage to the dielectric layer 14 and separate the dielectric layer 14 from the first substrate 11.

In a case where the sacrificial layer 12 of the present embodiment is not formed, energy is concentrated at an interface between the first substrate 11 and the dielectric layer 14 for thermal decomposition, thus potentially causing damage to the dielectric layer 14. Here, the laser beam may be adjusted in the output and irradiation method thereof to cause less damage, but still inevitably resulting in a damaged portion of about tens of nm or 100 nm. This portion has a low permittivity, thus decreasing overall capacitance of the capacitor. This renders it hard to design the dielectric layer 14 to achieve accurate capacitance.

Figure 3:
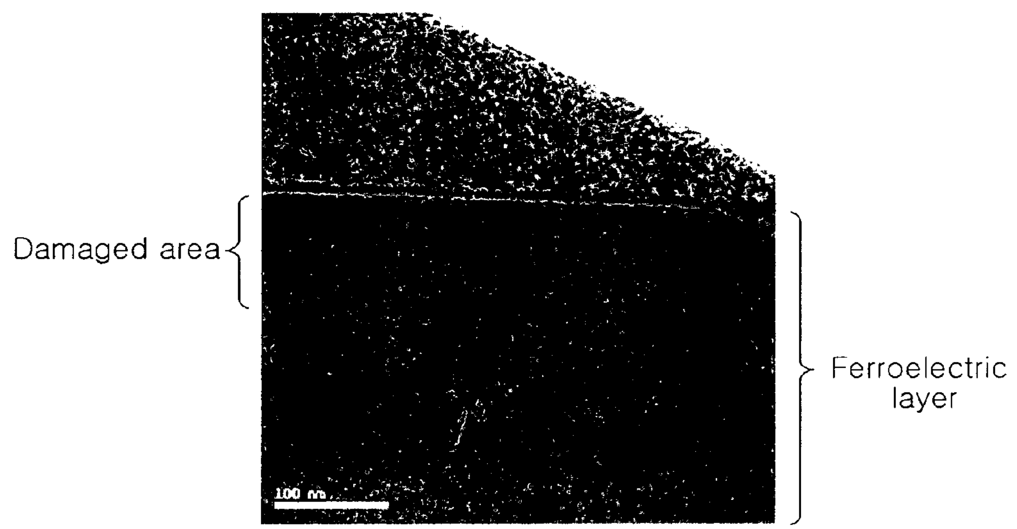
FIG. 3 illustrates a dielectric layer obtained by a laser lift-off process without forming a sacrificial layer.
Figure 4:
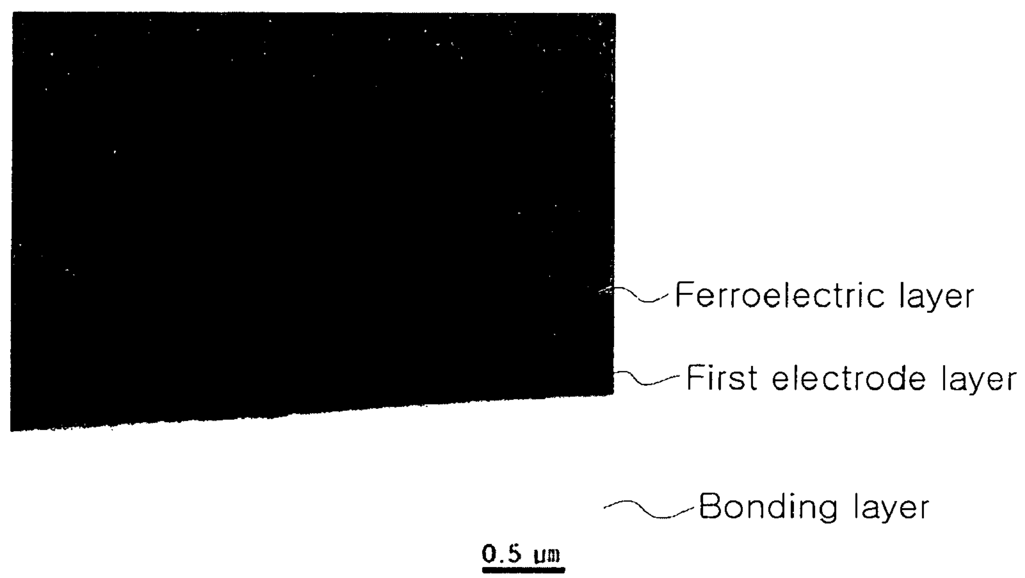
FIG. 4 illustrates a transfer structure for a thin film capacitor manufactured according to an exemplary embodiment of the invention.

To solve this problem, according to the present embodiment, the sacrificial layer 12 is disposed at an interface where the first substrate 11 and the dielectric layer 14 are to be separated from each other and then removed by the laser beam L to separate the first substrate 11 from the dielectric layer 14. This transfer method adopting a laser lift-off process renders the dielectric layer 14 unimpaired. FIG. 4 is an example of a transfer structure for a thin film capacitor manufactured according to the present invention. This picture of FIG. 4 illustrates the transfer structure in which a sacrificial layer is removed and a substrate is separated. Referring to FIG. 4, a ferroelectric layer is found free from a damaged portion of FIG. 3.

The type and irradiation method of the laser L for use in the present embodiment are not limited as long as the sacrificial layer is selectively decomposed by the laser beam. For example, the laser may adopt an excimer laser or an Nd:YAG laser. Alternatively, laser beams variously shaped as a circle, a square spot and a line may be moved in an irradiation position to scan a whole area.

Figure 2D:
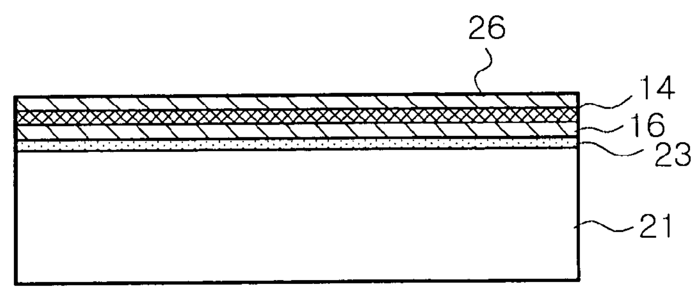

Afterwards, as shown in FIG. 2D, the first substrate 11 is removed and a second electrode layer 26 is formed on the dielectric layer 14 to complete the thin film capacitor.

The second electrode layer 26 employed in this process may be formed of a metal or oxide having an electrical conductivity in a similar manner to the first electrode layer 16. For example, the second electrode layer may be formed of at least one of Au, Ag, Ni, Cu, Al, Pt, Ti, Ir, $IrO_2$, Ru and $RuO_2$. The second electrode layer 26 may be formed by e.g., PVD, CVD, ALD, screen printing, plating and ink jet printing. Also, optionally, the second electrode layer 26 may undergo additional patterning to have a necessary pattern defining a desired capacitor region in a similar manner to the first electrode layer 16.

Moreover, a barrier layer (not shown) may be additionally formed between the dielectric layer 14 and the second electrode layer 26 to increase bonding strength therebetween and prevent the electrode layer from diffusing and oxidizing. The barrier layer may be formed of at least one of Ti, Cr, Al, Ta and alloys thereof, or a material such as TiN and TaN.

Meanwhile, prior to this process, even though the dielectric layer 14 may not experience damage, a material for the sacrificial layer 12 may partially remain without being completely removed from the dielectric layer 14. A remaining material of the sacrificial layer 12 is not desirable for dielectric properties, and thus may be removed by an additional cleaning process. The cleaning may be performed by various known methods such as wet etching using an etchant with appropriate selectivity or ion beam milling.

Subsequently, according to the present embodiment, by a general manufacturing process of the PCB, an insulating layer and a conductive layer may be formed in a desired number of alternations on the electrode layers overlying and underlying the dielectric layer. That is, after formation of the second electrode layer 26, at least one insulating layer having at least one of a conductive line and a conductive via hole is formed on the second electrode layer 26 to thereby produce a desired circuit board structure such as the PCB. For example, the insulating layer may adopt a resin coated copper (RCC) having a conductive layer thereon.

As set forth above, according to exemplary embodiments of the invention, a thin film capacitor employs a dielectric thin film which is heat treated at a high temperature using a laser lift-off process to have superior dielectric properties. This thin film capacitor can be effectively applied onto an insulating layer of a printed circuit board, which is vulnerable to heat treatment conditions. Also, according to the present embodiment, a sacrificial layer is utilized to cause substantially little damage to a dielectric layer, thereby beneficial for achieving a high-quality thin film capacitor.

While the present invention has been shown and described in connection with the exemplary embodiments, it will be apparent to those skilled in the art that modifications and variations can be made without departing from the spirit and scope of the invention as defined by the appended claims.

What is claimed is:

1. A method of manufacturing a circuit board embedding a thin film capacitor, the method comprising:

forming a sacrificial layer on a first substrate;

forming a dielectric layer on the sacrificial layer;

forming a first electrode layer on the dielectric layer;

disposing the first substrate on the second substrate in such a way that the first electrode layer is bonded to a top of a second substrate;

decomposing the sacrificial layer by irradiating a laser beam onto the sacrificial layer through the first substrate;

separating the first substrate from the second substrate;

forming a second electrode layer on the dielectric layer, the dielectric layer having a top surface from which the sacrificial layer is removed; and forming at least one insulating layer on the second electrode layer to have at least one of a conductive line and a conductive via hole therein.

2. The method of claim 1, wherein the sacrificial layer is formed of a material having an energy band gap lower than an energy band gap of a material for the first substrate material.

3. The method of claim 1, wherein the sacrificial layer is formed of at least one of indium tin oxide (ITO), $La_xSr_{1-x}CoO_3$(LSCO), $La_xPb_{1-x}CoO_3$(LPCO), PbO and GaN.

4. The method of claim 3, wherein the first substrate is formed of at least one of sapphire, quartz, glass, magnesium oxide (MgO), lanthanum aluminate ($LaAlO_3$), fused silica, and zirconia.

5. The method of claim 1, wherein the first substrate is formed of a material having a band gap energy greater than an energy corresponding to a wavelength of the laser beam.

6. The method of claim 1, wherein the dielectric layer is formed of at least one of plumbum zirconium titanate (PZT), plumbum lanthanium zirconium titanate (PLZT), barium titanate (BT), strontium bismuth tantalite (SBT), bismuth lanthanium titanate (BLT), plumbum magnesium-plumbum titanate (PMN-PT), and plumbum zinc niobate-plumbum titanate (PZN-PT).

7. The method of claim 1, wherein at least one of the first and second electrode layers is formed of at least one of Au, Ag, Ni, Cu, Al, Pt, Ti, Ir, $IrO_2$, Ru, and $RuO_2$.

8. The method of claim 1, wherein at least one of the first and second electrode layers is formed by one of physical vapor deposition, chemical vapor deposition, atomic layer deposition, screen printing, plating and ink jet printing.

9. The method of claim 1, further comprising cleaning a surface of the dielectric layer to remove a remaining material of the sacrificial layer from the dielectric layer, after the separating the first substrate from the second substrate.

10. The method of claim 1, wherein the disposing the first substrate on the second substrate comprises:

applying a bonding material on at least one of the first electrode layer of the first substrate and the top of the second substrate; and bonding the first electrode layer of the first substrate onto the second substrate using the bonding material.

11. The method of claim 10, wherein the bonding material is a bonding resin comprising a polymer.

12. The method of claim 1, wherein the first and second electrode layers have a predetermined pattern, respectively.

13. The method of claim 1, further comprising forming a barrier layer, between the forming a dielectric layer on the sacrificial layer and the forming a first electrode layer on the dielectric layer.

14. The method of claim 13, wherein the barrier layer is formed of at least one of Ti, Cr, Al, Ta and alloys thereof.

15. The method of claim 1, wherein the at least one insulating layer on the second electrode layer has both of a conductive line and a conductive via hole therein.

* * * * *